(12) United States Patent
Hoentschel et al.

(10) Patent No.: US 8,835,936 B2
(45) Date of Patent: Sep. 16, 2014

(54) SOURCE AND DRAIN DOPING USING DOPED RAISED SOURCE AND DRAIN REGIONS

(71) Applicant: GLOBALFOUNDRIES Inc., Grand Cayman, KY (US)

(72) Inventors: Jan Hoentschel, Dresden (DE); Stefan Flachowsky, Dresden (DE); Ralf Illgen, Dresden (DE)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 13/678,124

(22) Filed: Nov. 15, 2012

(65) Prior Publication Data

US 2014/0131735 A1 May 15, 2014

(51) Int. Cl.
*H01L 29/15* (2006.01)
*H01L 31/0312* (2006.01)
*H01L 29/16* (2006.01)
*H01L 29/78* (2006.01)

(52) U.S. Cl.
CPC ............ *H01L 29/78* (2013.01); *H01L 29/1608* (2013.01)
USPC ............................................. 257/77

(58) Field of Classification Search
USPC .............. 257/77, 711, E21.619, E21.634, 257/455–456, 576, 754–757, 213–413, 900, 257/902–903, 523, 656, E29.287, 257/E21.561–E21.57, E21.7–E21.704, 257/E27.112, 21.704, E21.135; 438/149–166, 295, 311, 401–413, 438/458–459, 479–481, 964
See application file for complete search history.

(56) References Cited

U.S. PATENT DOCUMENTS

| | | | |
|---|---|---|---|
| 2010/0078653 A1* | 4/2010 | Griebenow et al. | 257/77 |
| 2011/0037125 A1* | 2/2011 | Cheng et al. | 257/351 |
| 2011/0291196 A1 | 12/2011 | Wei et al. | |
| 2012/0256238 A1* | 10/2012 | Ning et al. | 257/280 |
| 2013/0026575 A1* | 1/2013 | Moroz et al. | 257/348 |
| 2013/0214358 A1* | 8/2013 | Jagannathan et al. | 257/347 |

* cited by examiner

*Primary Examiner* — Dao H Nguyen
*Assistant Examiner* — Tram H Nguyen
(74) *Attorney, Agent, or Firm* — Amerson Law Firm, PLLC

(57) ABSTRACT

A method comprises providing a semiconductor structure comprising a substrate, an electrically insulating layer on the substrate and a semiconductor feature on the electrically insulating layer. A gate structure is formed on the semiconductor feature. An in situ doped semiconductor material is deposited on portions of the semiconductor feature adjacent the gate structure. Dopant is diffused from the in situ doped semiconductor material into the portions of the semiconductor feature adjacent the gate structure, the diffusion of the dopant into the portions of the semiconductor feature adjacent the gate structure forming doped source and drain regions in the semiconductor feature.

24 Claims, 11 Drawing Sheets

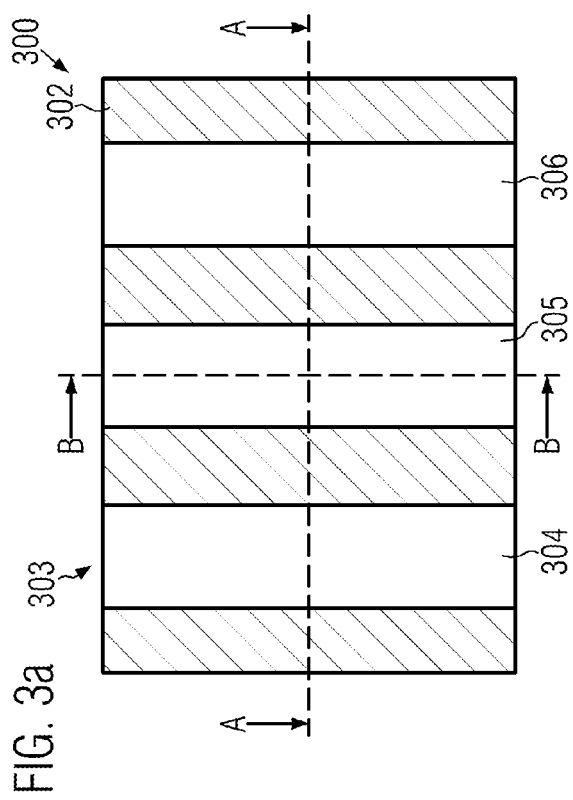
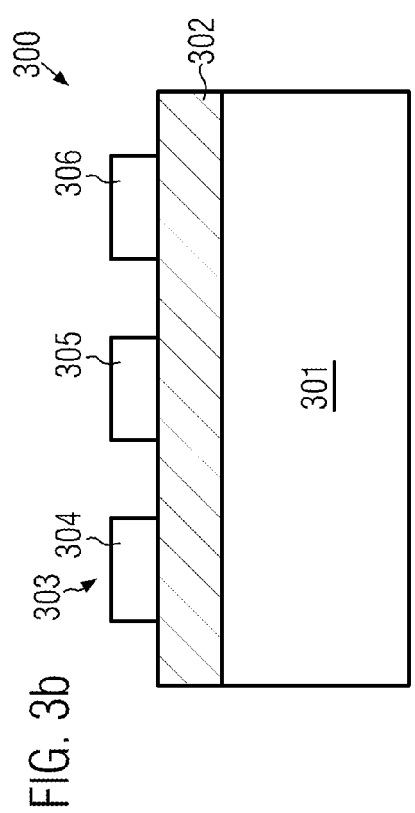
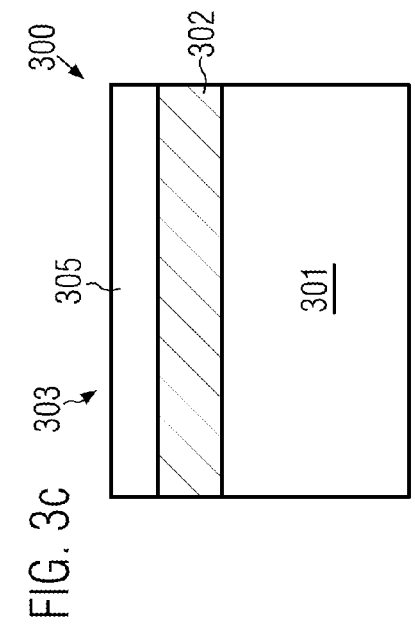
FIG. 3a
FIG. 3b
FIG. 3c

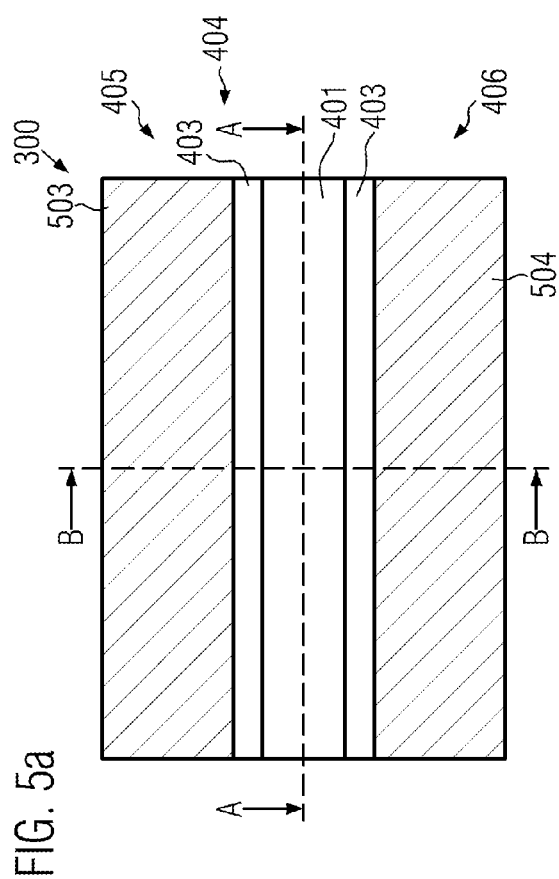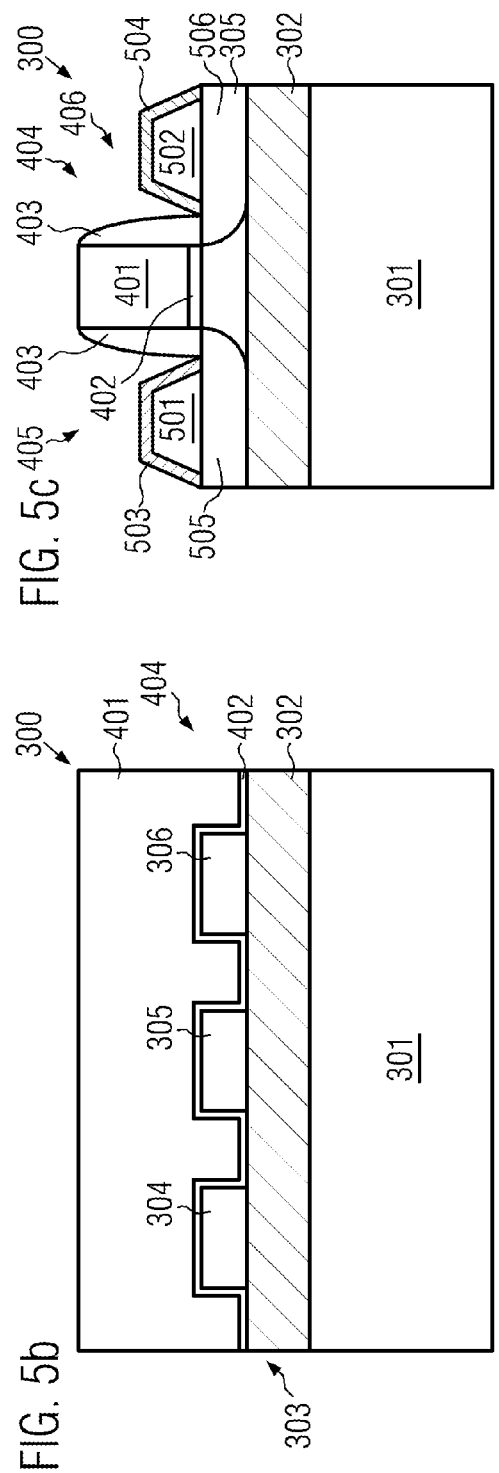

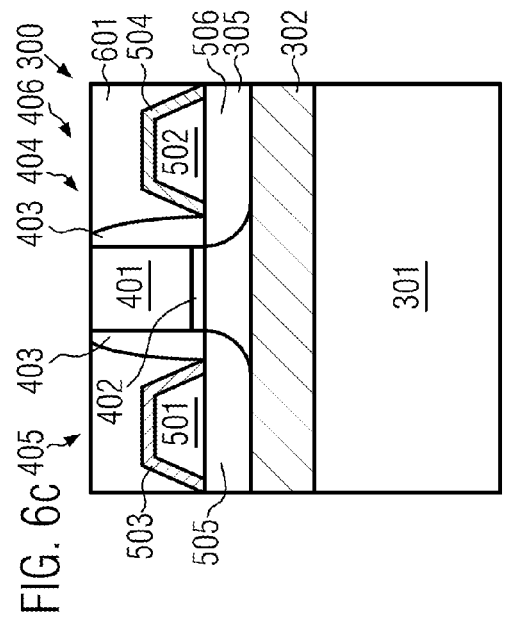
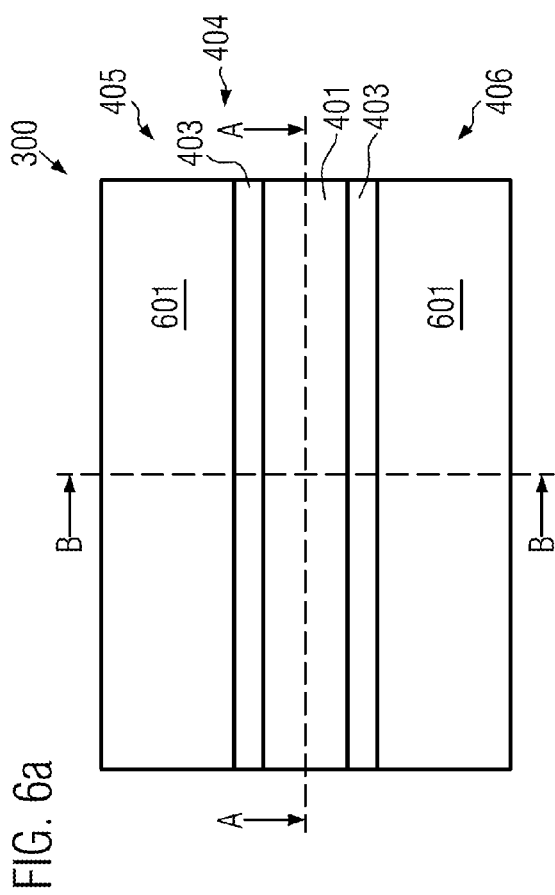
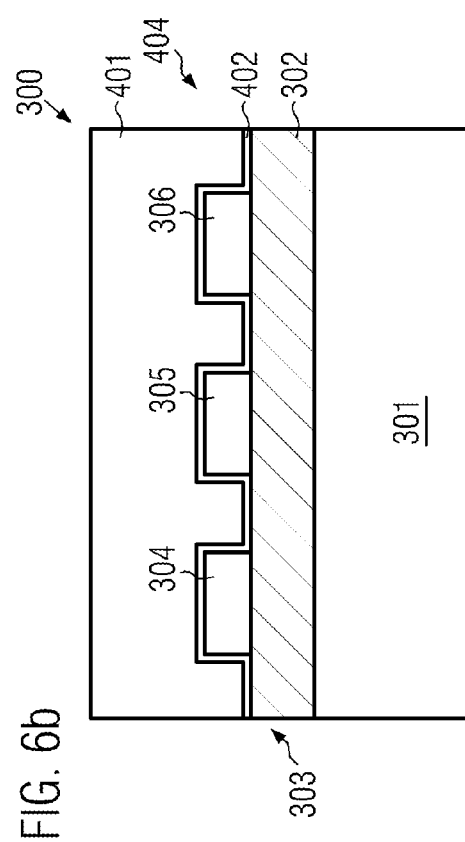

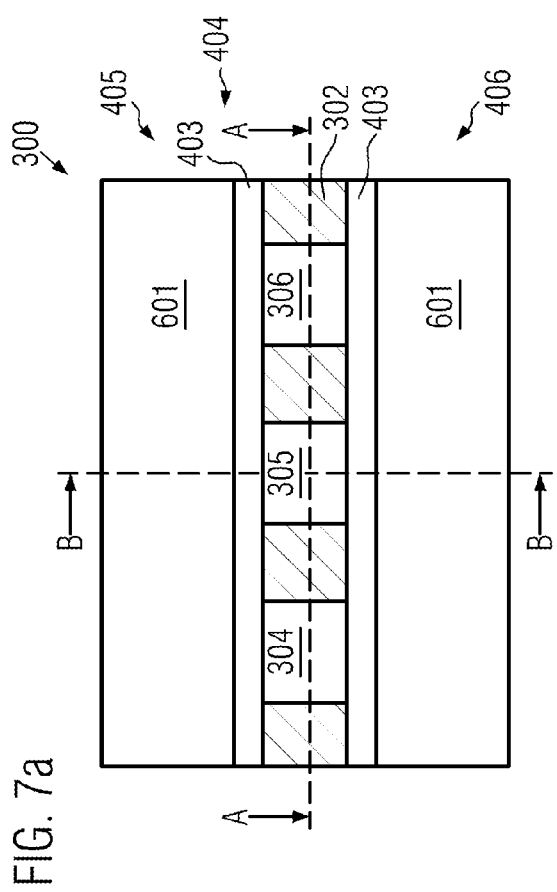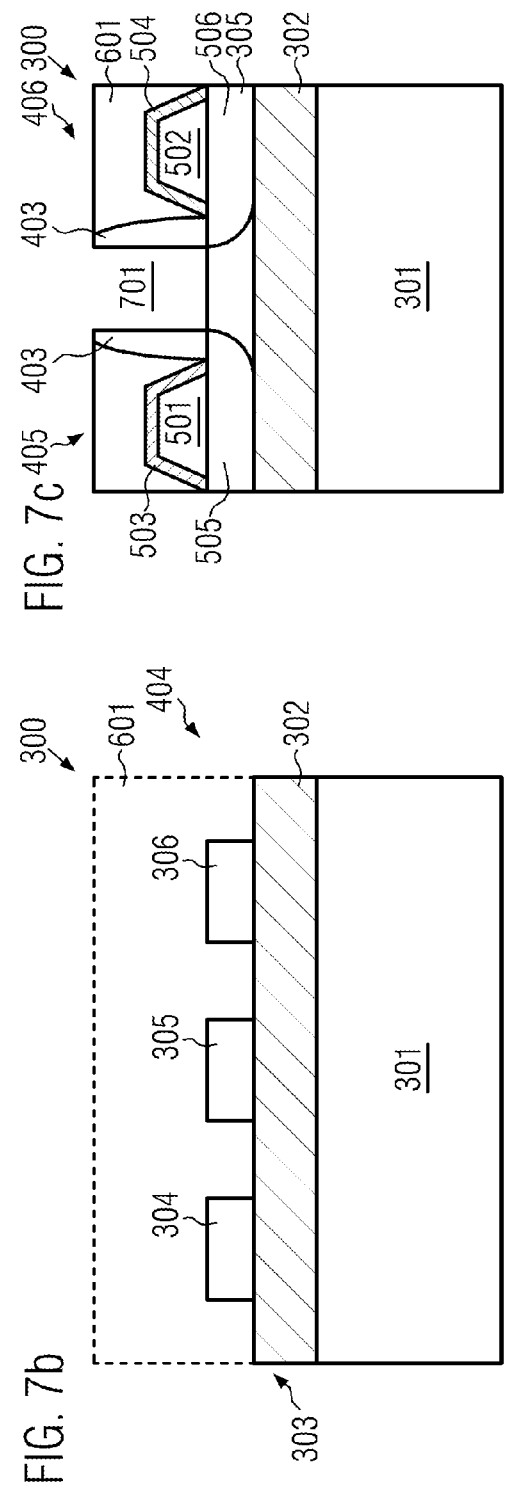

SOURCE AND DRAIN DOPING USING DOPED RAISED SOURCE AND DRAIN REGIONS

BACKGROUND OF THE INVENTION

1. Field of the Invention

Generally, the present disclosure relates to the field of integrated circuits, and, more particularly, to integrated circuits wherein semiconductor-on-insulator techniques are employed.

2. Description of the Related Art

Integrated circuits typically include a large number of circuit elements, which include, in particular, field effect transistors. In a field effect transistor, a gate electrode may be separated from a channel region by a gate insulation layer that provides an electrical insulation between the gate electrode and the channel region. Adjacent the channel region, a source region and a drain region are provided.

The channel region, the source region and the drain region are formed in a semiconductor material, wherein the doping of the channel region is different from the doping of the source region and the drain region. Depending on an electric voltage applied to the gate electrode, the field effect transistor may be switched between an on-state and an off-state.

For improving the performance of integrated circuits including field effect transistors, it has been proposed to employ semiconductor-on-insulator technology. In semiconductor-on-insulator technology, the source, channel and drain regions of transistors are formed in a thin layer of a semiconductor material, for example, silicon. The thin layer of semiconductor material is provided above a substrate of a semiconductor material, for example, silicon, and separated from the substrate by an electrically insulating material, for example, silicon dioxide. Compared to integrated circuits wherein field effect transistors are formed on the basis of a bulk semiconductor substrate, semiconductor-on-insulator technology allows reducing parasitic capacitances and leakage currents and a sensitivity of integrated circuits with respect to ionizing radiation.

However, semiconductor-on-insulator technology has some specific issues associated therewith, which include the so-called floating body effect. The body of a semiconductor-on-insulator field effect transistor forms a capacitor with the insulated substrate. On this capacitor, electric charge can accumulate and cause adverse effects, including a dependence of the threshold voltage of the field effect transistor on its previous states and a reduced controllability of the conductance of the channel.

Various approaches have been proposed for improving the performance of semiconductor-on-insulator field effect transistors.

US Patent Publication No. 2011/0291196 discloses a semiconductor device that includes a FinFET or tri-gate transistor on the basis of a semiconductor-on-insulator substrate. The semiconductor device includes a silicon substrate, above which is formed a buried insulating layer, typically in the form of a silicon dioxide material. Furthermore, a plurality of semiconductor fins are provided and represent the "residues" of a silicon layer initially formed on the buried insulating layer. The fins include a source region, a drain region and a channel region. The extension of the channel region along the length direction of the fins is determined by a gate electrode structure including an electrode material, such as polysilicon, and a spacer structure. A gate dielectric material separates the electrode material from the semiconductor material of the channel region at the sidewalls of the fins and, in the case of a tri-gate transistor, on the top surface of the fins. Transistors wherein the channel region is formed in fins may have an improved controllability of the channel.

Furthermore, fully depleted field effect transistors have been proposed. Fully depleted field effect transistors are formed using a semiconductor-on-insulator structure, wherein the semiconductor layer provided on the insulator layer has a smaller thickness than a channel depletion width. Thus, the electric charge and, accordingly, the body potential of the field effect transistor is fixed, which may be helpful for avoiding or at least reducing the floating body effect and for improving channel controllability.

The manufacturing of a fully depleted field effect transistor will be described with reference to FIG. 1. FIG. 1 shows a schematic cross-sectional view of a semiconductor structure 100. The semiconductor structure includes a substrate 101. On the substrate 101, an electrically insulating layer 102 is formed. A semiconductor layer 103 is formed on the electrically insulating layer 102. The substrate 101, the electrically insulating layer 102 and the semiconductor layer 103 provide a semiconductor-on-insulator structure.

A trench isolation 104, which may include a shallow trench isolation structure, separates a portion of the semiconductor layer 103 wherein an active region of a fully depleted field effect transistor 105 is formed from other portions of the semiconductor layer 103 (not shown). On the semiconductor layer 103, a gate structure 106 is provided. The gate structure 106 includes a gate insulation layer 107, which may include a high-k material having a greater dielectric constant than silicon dioxide, and a gate electrode 110 including a metal portion 108 and a polysilicon portion 109. Adjacent the gate electrode 110, a sidewall spacer 112 is provided, which is separated from the gate electrode 110 by a liner layer 111. The field effect transistor 105 further includes a source region 114 and a drain region 116 adjacent the gate structure 106. The source region 114 and the drain region 116 are differently doped than a channel region 115 below the gate electrode 110, and may include source and drain extensions extending below the sidewall spacer 112.

These features may be formed using techniques for providing a semiconductor-on-insulator structure, including oxidation, bonding, cleaving and polishing of semiconductor wafers, and techniques for forming field effect transistors, such as deposition, oxidation, photolithography, etching and ion implantation.

In particular, the formation of the source region 114 and the drain region 116, and the formation of source and drain extensions, may include one or more ion implantation processes, as shown schematically by arrows 113 in FIG. 1.

In an ion implantation process, the semiconductor structure 100 is bombarded with energetic ions of a dopant. The ions are incorporated into the semiconductor material of the semiconductor layer 103 and provide the doping of the source region 114 and the drain region 116. The channel region 115 is protected from the ions by the gate structure 106. While ion implantation processes for forming the source region 114 and the drain region 116 may be performed after the formation of the sidewall spacer 112, ion implantations for forming source and drain extensions may be performed before the formation of the sidewall spacer 112.

However, due to the bombardment of portions of the semiconductor layer 103 with energetic ions in the ion implantation processes, the crystalline structure of the material of the semiconductor layer 103 may be destroyed, so that amorphous material may be obtained in the source region 114 and the drain region 116, and possibly also in the source and drain extensions.

Thus, portions of the semiconductor layer 103 adjacent the gate structure 106 are amorphized. The amorphized material cannot easily be re-healed by means of a thermal annealing process, since, due to the semiconductor-on-insulator structure with the thin semiconductor layer 103 that is employed for forming the fully depleted field effect transistor 105, substantially no crystalline semiconductor material is left below the amorphized material.

The amorphous structure of the source region 114 and the drain region 116 may lead to an increased electrical resistance between the channel region 115 and the source region 114, and between the channel region 115 and the drain region 116. Furthermore, the amorphous structure of the source region 114 and the drain region 116 may lead to an increased contact resistance between the source region 114 and the drain region 116, respectively, and electrical connections thereto, and to an increased leakage current of the field effect transistor 105.

Similar issues as described above in the context of fully depleted field effect transistors may also occur in the formation of semiconductor-on-insulator FinFET or tri-gate transistors.

In view of the situation described above, the present disclosure provides a device and a method wherein some or all of the above-mentioned issues may be overcome or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure including a substrate, an electrically insulating layer on the substrate and a semiconductor feature on the electrically insulating layer. A gate structure is formed on the semiconductor feature. An in situ doped semiconductor material is deposited on portions of the semiconductor feature adjacent the gate structure. Dopant from the in situ doped semiconductor material is diffused into the portions of the semiconductor feature adjacent the gate structure. The diffusion of the dopant into the portion of the semiconductor feature adjacent the gate structure forms doped source and drain regions in the semiconductor feature.

Another illustrative method disclosed herein includes providing a semiconductor structure including a semiconductor substrate, a layer of an electrically insulating material on the substrate, a first semiconductor feature on the electrically insulating material and a second semiconductor feature on the electrically insulating material. A first gate structure is formed on the first semiconductor feature, and a second gate structure is formed on the second semiconductor feature. A first mask is formed. The first mask covers the second gate structure and the second semiconductor feature and does not cover the first gate structure and the first semiconductor feature. A first in situ doped semiconductor material is deposited on the first semiconductor feature adjacent the first gate structure. The first in situ doped semiconductor material includes a first dopant. The first mask is removed, and a second mask is formed. The second mask covers the first gate structure and the first semiconductor feature and does not cover the second gate structure and the second semiconductor feature. A second in situ doped semiconductor material is deposited on the second semiconductor feature adjacent the second gate structure. The second in situ doped semiconductor material includes a second dopant different from the first dopant. The second mask is removed, and an annealing process is performed. In the annealing process, a portion of the first dopant diffuses from the first in situ doped semiconductor material into the portions of the first semiconductor feature adjacent the first gate structure. A portion of the second dopant diffuses from the second in situ doped semiconductor material into the portions of the second semiconductor feature adjacent the second gate structure.

An illustrative device disclosed herein includes a semiconductor structure. The semiconductor structure includes a semiconductor substrate, an electrically insulating material on the semiconductor substrate and a semiconductor feature on the electrically insulating material. A gate structure is provided on the semiconductor feature. Adjacent the gate structure, a raised source region and a raised drain region are provided on the semiconductor feature. Portions of the semiconductor feature below the raised source region and the raised drain region are differently doped than a portion of the semiconductor feature below the gate structure and include the same dopant as the raised source region and the raised drain region. The portions of the semiconductor feature below the raised source region and below the raised drain region have a substantially single crystalline structure.

BRIEF DESCRIPTION OF THE DRAWINGS

The disclosure may be understood by reference to the following description taken in conjunction with the accompanying drawings, in which like reference numerals identify like elements, and in which:

FIGS. 3a, 3b and 3c show a schematic top view and cross-sectional views, respectively, of a semiconductor structure according to an embodiment in a stage of a method according to an embodiment;

FIGS. 5a, 5b and 5c show a schematic top view and cross-sectional views, respectively, of a semiconductor structure according to an embodiment in a stage of a method according to an embodiment;

FIGS. 6a, 6b and 6c show a schematic top view and cross-sectional views, respectively, of a semiconductor structure according to an embodiment in a stage of a method according to an embodiment;

FIGS. 7a, 7b and 7c show a schematic top view and cross-sectional views, respectively, of a semiconductor structure according to an embodiment in a stage of a method according to an embodiment.

Figure 1:
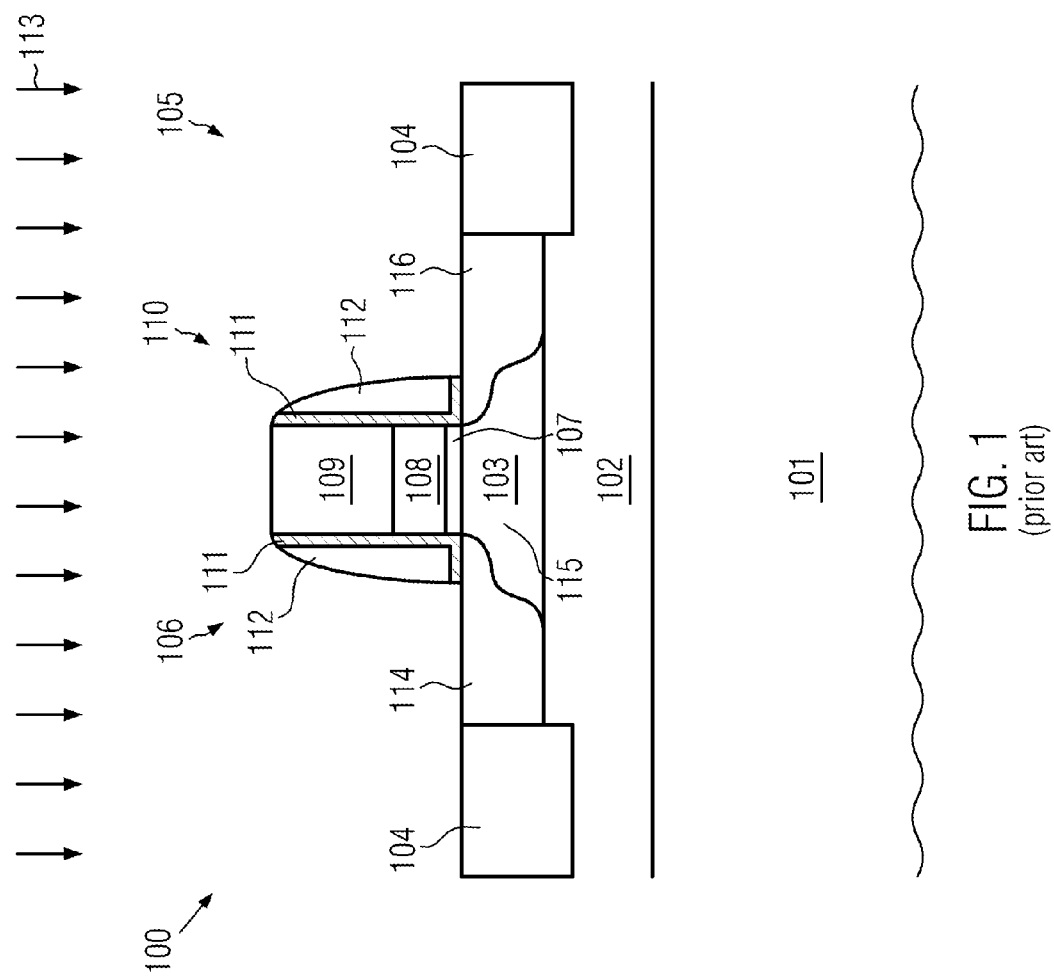
FIG. 1 shows a schematic cross-sectional view of a conventional semiconductor-on-insulator field effect transistor in a stage of a manufacturing process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

Figure 2A:
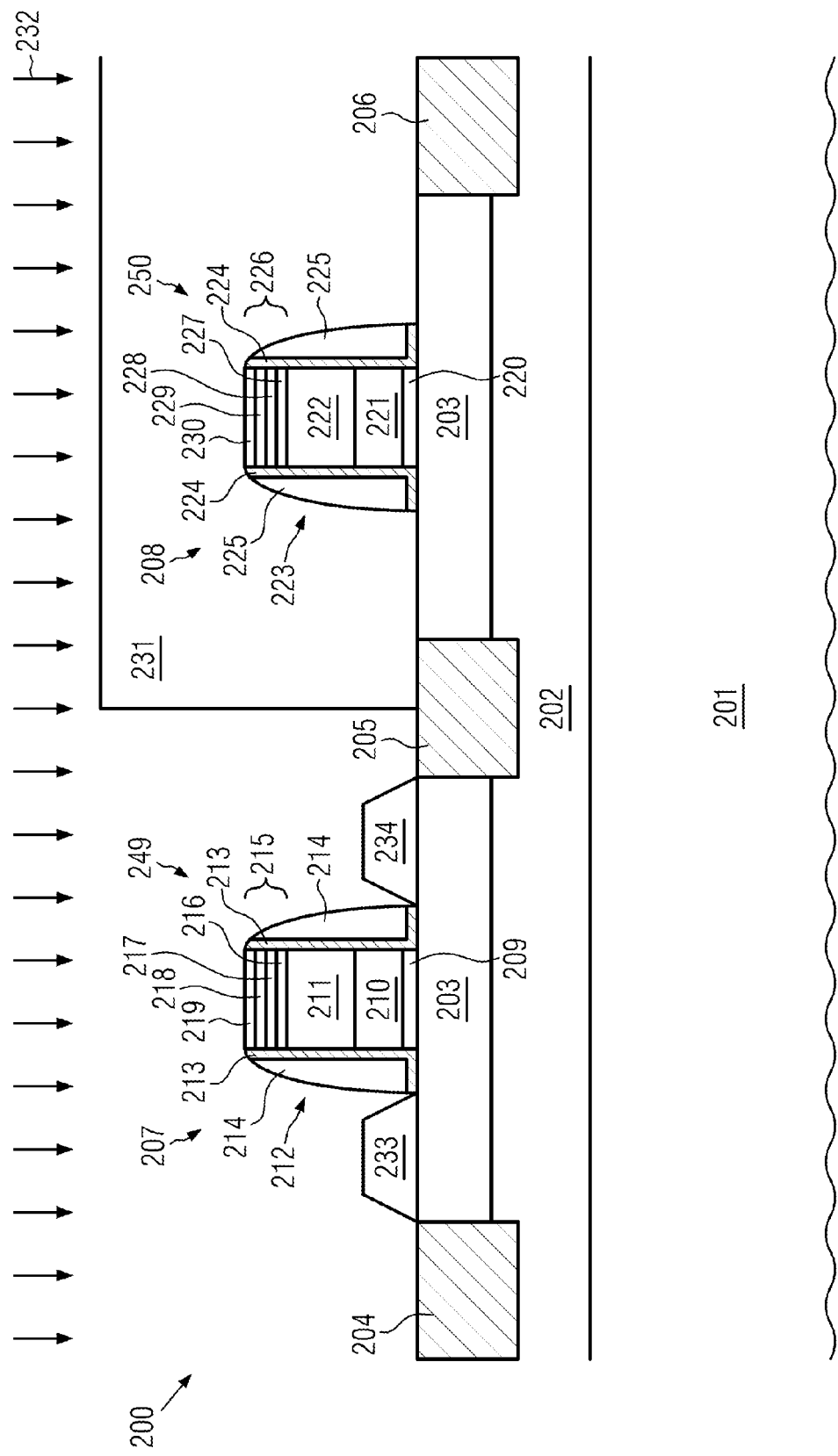
FIGS. 2a-2d show schematic cross-sectional views of a semiconductor structure according to an embodiment in stages of a method according to an embodiment.

FIG. 2a shows a schematic cross-sectional view of a semiconductor structure 200 according to an embodiment in a first stage of a method for manufacturing a semiconductor structure according to an embodiment. The semiconductor structure 200 includes a semiconductor substrate 201. The semiconductor substrate 201 may be provided in the form of a wafer of a semiconductor material, for example, silicon. On the substrate 201, an electrically insulating layer 202 and a semiconductor layer 203 may be formed. The substrate 201, the electrically insulating layer 202 and the semiconductor layer 203 provide a semiconductor-on-insulator structure.

The electrically insulating layer 202 may include a dielectric material, such as silicon dioxide, and may be an ultra-thin buried oxide (UT-BOX) having a thickness in a range from about 10-20 nm.

The semiconductor layer 203 may include silicon. In embodiments wherein the semiconductor layer 203 includes silicon, the semiconductor layer 203 may include strained silicon or unstrained silicon. In some embodiments, the semiconductor layer 203 may include semiconductor materials other than silicon, for example, silicon/germanium, silicon carbide or a III-V material such as, for example, gallium arsenide. The semiconductor layer 203 may have a thickness suitable for forming a fully depleted field effect transistor, for example, a thickness in a range from about 5-8 nm.

The semiconductor structure 200 further includes trench isolations 204, 205, 206 which can separate portions of the semiconductor layer 203 from each other and provide electrical insulation between the portions of the semiconductor layer 203. A portion of the semiconductor layer 203 enclosed by the trench isolations 204, 205 may provide a semiconductor feature wherein an active region of a field effect transistor 207 is formed, and a portion of the semiconductor layer 203 enclosed by trench isolations 205, 206 may provide a semiconductor feature wherein an active region of another field effect transistor 208 is formed. In embodiments, some or all of the trench isolations 204, 205, 206 may be part of a contiguous trench isolation structure.

The field effect transistor 207 includes a gate structure 249 that is formed on the portion of the semiconductor layer 203 enclosed by trench isolations 204, 205. The gate structure 249 includes a gate insulation layer 209 and a gate electrode 212. The gate electrode 212 may include a metal portion 210 and a polysilicon portion 211.

In some embodiments, the gate insulation layer 209 may be formed of a dielectric material having a greater dielectric constant than silicon dioxide, for example, a dielectric constant greater than four. The gate insulation layer 209 may include hafnium silicon oxynitride (HfSiON) and/or hafnium dioxide ($HfO_2$).

The metal portion 210 of the gate electrode 212 may include a metal that is suitable for adapting a work function of the gate electrode 212 to a work function of the semiconductor material of the semiconductor layer 203. The material of the metal portion 210 of the gate electrode 212 may depend on whether the transistor 207 is a P-channel transistor or an N-channel transistor. In embodiments wherein the transistor 207 is an N-channel transistor, the metal may include La, LaN or TiN. In embodiments wherein the transistor 207 is a P-channel transistor, the metal may include Al, AlN or TiN.

In other embodiments, the gate insulation layer 209 may include silicon dioxide, and the gate electrode 212 may be formed of polysilicon that is provided directly on the gate insulation layer 209.

An encapsulation 215 may be provided on the gate electrode 212. The encapsulation 215 may include a plurality of layers 216, 217, 218, 219, wherein layers 216, 218 are formed of a first material, and layers 217, 219 are formed of a second material. The first material and the second material may be selected such that they can be selectively etched relative to each other. In the selective etching of a material relative to another material, an etch rate of the material is greater than an etch rate of the other material when both materials are exposed to an etchant used in the selective etch process, so that the material is affected by the etchant to a greater extent than the other material. In some embodiments, the layers 216, 218 of the encapsulation 215 may include silicon dioxide, and the layers 217, 219 of the encapsulation 215 may include silicon nitride.

The gate structure 249 further includes a sidewall spacer 214 adjacent the gate electrode 212. A liner layer 213 may be provided between the gate electrode 212 and the sidewall spacer 214. The sidewall spacer 214 may include silicon dioxide, and the liner layer 213 may include silicon nitride. In other embodiments, the sidewall spacer 214 may include silicon nitride, and the liner layer 213 may include silicon dioxide.

The sidewall spacer 214 may have a thickness, measured in a direction perpendicular to a side surface of the gate electrode 212, of about 8 nm, and the liner layer 213 may have a thickness of about 4.5 nm.

Similar to the transistor 207, the transistor 208 includes a gate structure 250. The gate structure 250 is formed on the portion of the semiconductor layer 203 enclosed by the trench isolations 205, 206. The gate structure 250 may include a gate insulation layer 220 and a gate electrode 223 including a metal portion 221 and a polysilicon portion 222. An encapsulation 226 may be provided on the gate electrode 223, wherein the encapsulation 226 includes layers 227, 229 of a first material, for example, silicon dioxide, and layers 228, 230 of a second material, for example, silicon nitride, wherein the first material and the second material may be selectively etched relative to each other. In other embodiments, the metal portion 221 of the gate electrode 223 may be omitted, and the gate electrode 223 may be formed of polysilicon that is provided directly on the gate insulation layer 220.

Further features of the gate electrode 223 and the gate insulation layer 220 of the transistor 208 may correspond to features of the gate electrode 212 and the gate insulation layer 209 of the transistor 207 wherein, however, different materials may be used for the metal portions 210, 221 of the gate electrodes 212, 223. In some embodiments, the transistor 207 may be an N-channel transistor, wherein the metal portion 210 of the gate electrode 212 includes La, LaN or TiN, and the transistor 208 may be a P-channel transistor, wherein the metal portion 221 of the gate electrode 223 includes Al, AlN or TiN.

A sidewall spacer 225 may be provided adjacent the gate electrode 223, with a liner layer 224 between the gate electrode 223 and the sidewall spacer 225. The sidewall spacer 225 and the liner layer 224 may have features corresponding to those of the liner layer 213 and the sidewall spacer 214 of the transistor 207 described above.

For providing the above-described features of the semiconductor structure 200, a semiconductor-on-insulator structure including the substrate 201, the electrically insulating layer 202 and the semiconductor layer 203 may be formed by means of techniques of forming a semiconductor-on-insulator structure including a bonding of two wafers, wherein at least one of the wafers has a layer of the dielectric material of the electrically insulating layer 202 formed thereon, cleaving one of the wafers, optionally at a location wherein hydrogen has been implanted into the wafer, and polishing a semiconductor material of the cleaved wafer to provide a smooth surface of the semiconductor layer 203 that is formed of a portion of the cleaved wafer.

Thereafter, the trench isolations 204, 205, 206 may be formed. The trench isolations 204, 205, 206 may be shallow trench isolation structures and may be formed by means of techniques for forming shallow trench isolation structures, including photolithography, etching, oxidation and deposition.

Then, the gate insulation layers 209, 220, the gate electrodes 212, 223 and the encapsulations 215, 226 may be formed by depositing materials of the gate insulation layers 209, 220, the metal portions 210, 221, the polysilicon portions 211, 222 of the gate electrodes 212, 223 and the layers 216 to 219 and 227 to 230 of the encapsulations 215, 226, and structuring the materials by means of processes of photolithography and etching.

Thereafter, a material of the liner layers 213, 224 may be deposited by means of a deposition technique, such as atomic layer deposition, and the sidewall spacers 214, 225 may be formed. The formation of the sidewall spacers 214, 225 may include a substantially isotropic deposition of a layer of a material of the sidewall spacers 214, 225.

In embodiments wherein the sidewall spacers 214, 225 include silicon dioxide, a chemical vapor deposition process, wherein tetraethyl orthosilicate (TEOS) is employed as a reactant gas and the chemical vapor deposition process is performed at a relatively low pressure, may be performed for depositing a layer of silicon dioxide over the semiconductor structure 200. Features of the chemical vapor deposition process may correspond to known LPTEOS deposition processes for the formation of silicon dioxide layers. In other embodiments, a material layer for forming the sidewall spacers 214, 225 may be formed by means of other processes, for example, high temperature oxidation (HTO). In embodiments wherein the sidewall spacers 214, 225 include silicon nitride, a silicon nitride layer may be substantially isotropically deposited on the semiconductor structure 200.

After the substantially isotropic deposition of the layer of the material of the sidewall spacers 214, 225, an anisotropic etch process, for example, a reactive ion etch process, may be performed for removing portions of the layer over substantially horizontal portions of the surface of the semiconductor structure 200, for example, portions of the surface of the material layer 203 and top surfaces of the encapsulations 215, 226, whereas portions of the layer on inclined surfaces of the semiconductor structure 200, such as the sidewalls of the gate electrodes 212, 226, remain on the surface of the semiconductor structure 200.

The liner layers 213, 224 may be used as etch stop layers for the anisotropic etch process. After the formation of the sidewall spacers 214, 225, portions of the liner layer 213, 224 may be removed, and a mask 231 may be formed over the transistor 208. The mask 231 covers the transistor 208 but does not cover the transistor 207. In particular, the mask 231 does not cover the gate structure 249 of the transistor 207 and portions of the semiconductor layer 203 adjacent the gate structure 249.

The mask 231 may be a hardmask, for example, a hardmask including silicon nitride, and may be formed by depositing a layer of a material of the mask 231 and structuring the material by means of photolithography and etching.

After the formation of the mask 231, a semiconductor material may be deposited on portions of the semiconductor layer 203 adjacent the gate structure 249 by means of a deposition process schematically denoted by arrows 232 in FIG. 2a.

The deposition process 232 may be a selective deposition process, for example, a selective epitaxial growth process, that is adapted for depositing the semiconductor material on the exposed portions of the semiconductor layer 203 adjacent the gate structure 249 but not on portions of the semiconductor structure 200 whose surface is covered by materials different from the material of the semiconductor layer 203.

In particular, the deposition process 232 may be adapted such that substantially no semiconductor material or only a small amount of semiconductor material is deposited on silicon dioxide and/or silicon nitride. Thus, substantially no semiconductor material or only a small amount of semiconductor material is deposited on exposed portions of the trench isolation structures 204, 205, the sidewall spacer 214, the liner layer 213 and the topmost layer 219 of the encapsulation 215. Moreover, substantially no semiconductor material or only a small amount of semiconductor material is deposited on the mask 231.

The deposition of semiconductor material on the exposed portions of the semiconductor layer 203 adjacent the gate structure 249 by the deposition process 232 forms a raised source region 233 and a raised drain region 234 adjacent the gate structure 249.

In some embodiments, the raised source region 233 and the raised drain region 234 may include silicon. In such embodiments, the deposition process 232 may be a selective epitaxial growth process for the selective deposition of silicon. In particular, the deposition process 232 may be a chemical vapor deposition process or a plasma-enhanced chemical vapor deposition process, wherein a reactant gas including chlorine, such as $SiCl_4$, $SiHCl_3$ or $SiH_2Cl_2$, is used and/or wherein a chemical compound including chlorine, such as HCl, is used in addition to a reactant including silicon, such as $SiH_4$ or $Si_2H_6$. Chlorine atoms can react chemically with silicon deposited on silicon dioxide or silicon nitride and create gaseous reaction products that can be pumped out of the reaction chamber, whereas silicon deposited on a surface of the semiconductor structure 200 including crystalline silicon can remain on the semiconductor structure 200 and form the raised source region 233 and the raised drain region 234.

The deposition process 232 need not be a chemical vapor deposition process or a plasma-enhanced chemical vapor deposition process as described above. Alternatively, molecular beam epitaxy (MBE) or metal-organic chemical vapor deposition (MOCVD) may be employed.

Moreover, the raised source region 233 and the raised drain region 234 need not be formed of silicon. In some embodiments, the raised source region 233 and the raised drain region 234 may include a compound semiconductor material, such as silicon/germanium or silicon carbide. Deposition techniques for selectively depositing silicon/germanium or silicon carbide on the semiconductor layer 203 may include chemical vapor deposition, plasma-enhanced chemical vapor deposition, molecular beam epitaxy or metal-organic chemical vapor deposition. Forming the raised source region 233 and the raised drain region 234 from a semiconductor material that is different from the material of the semiconductor layer 203 may help to provide an elastic strain in a channel region of the transistor 207 below the gate electrode 212 due to different lattice constants of the materials of the semiconductor layer 203 and the raised source and drain regions 233, 234. The type of strain (tensile or compressive) may be adapted by selecting an appropriate material of the raised source region 233 and the raised drain region 234. Materials for the raised source and drain regions include silicon carbide, which may help to provide an elastic strain suitable for increasing the mobility of electrons in an N-type transistor when formed on a semiconductor layer 203 comprising silicon, and silicon/germanium, which may provide an elastic strain suitable for increasing the mobility of holes in a P-type transistor when formed on a semiconductor layer 203 comprising silicon.

The deposition process 232 may be adapted such that the semiconductor material of the raised source region 233 and the raised drain region 234 is doped. For this purpose, a dopant species, which may be a chemical compound including a dopant or a dopant in atomic or molecular form, may be supplied during the deposition process 232. Thus, the dopant is incorporated into the semiconductor material of the raised source region 233 and the raised drain region 234, and the raised source region 233 and the raised drain region 234 are formed of doped semiconductor material. In embodiments wherein the transistor 207 is an N-channel field effect transistor, an N-type dopant, such as phosphor (P) or arsenic (As), may be included into the semiconductor material of the raised source region 233 and the raised drain region 234 by supplying a dopant species such as phosphine ($PH_3$) or arsine ($AsH_3$) during the deposition process 232. In embodiments wherein the transistor 207 is a P-channel field effect transistor, the raised source region 233 and the raised drain region 234 may be doped with a P-type dopant, such as boron, by supplying a dopant species such as boron, boron difluoride ($BF_2$) and/or diborane ($B_2H_6$) during the deposition process 232.

Figure 2B:
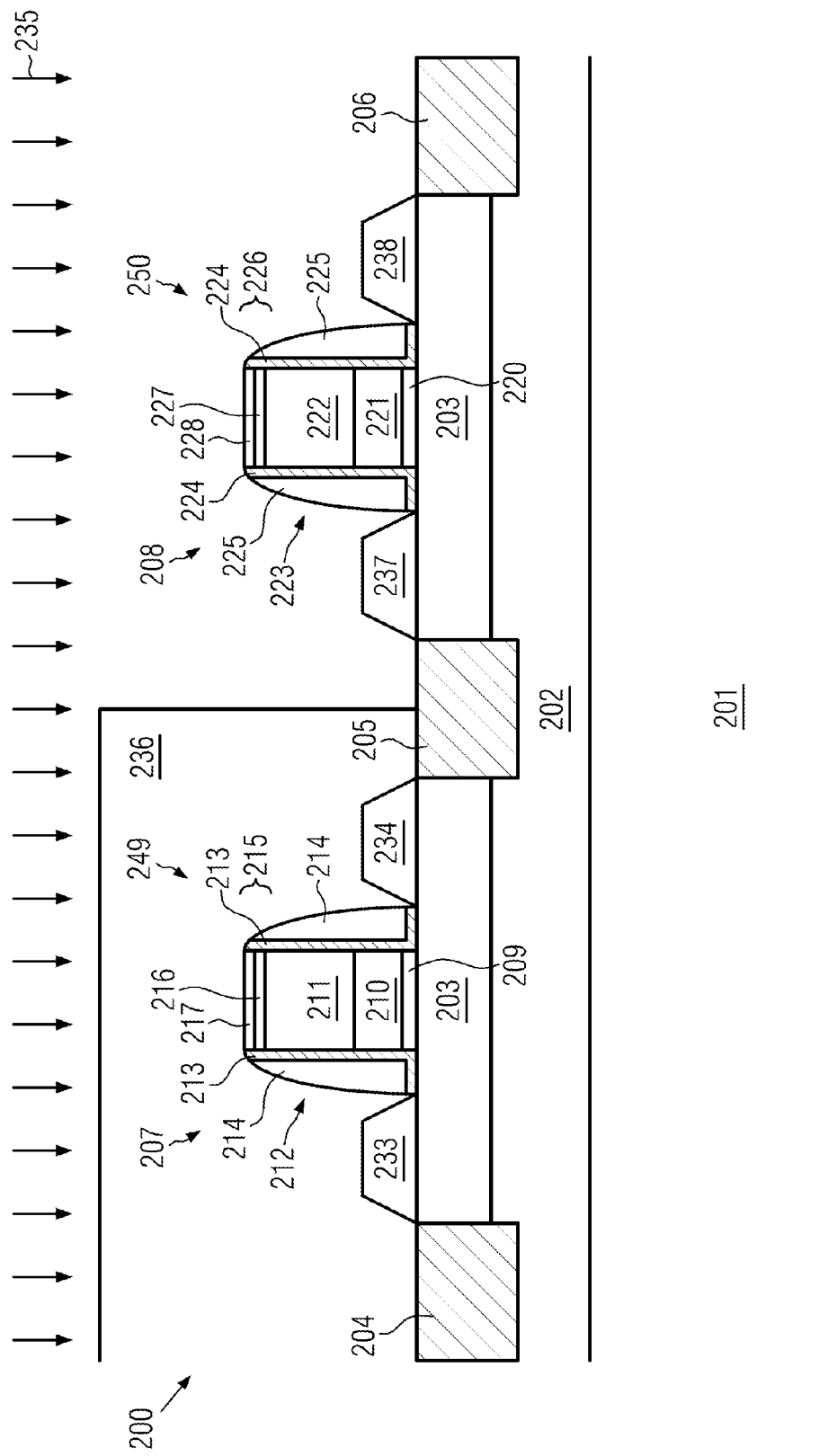

FIG. 2b shows a schematic cross-sectional view of the semiconductor structure 200 in a later stage of the manufacturing process. After the deposition of the semiconductor material of the raised source region 233 and the raised drain region 234, the mask 231 may be removed. For this purpose, an etch process adapted for selectively removing the material of the mask 231 relative to other materials of the semiconductor structure 200 may be employed. In particular, the etch process may be adapted to selectively remove the material of the mask 231 relative to materials of the sidewall spacer 225, the trench isolations 204, 205, 206 and the semiconductor material or semiconductor materials of the material layer 203 and the raised source and drain regions 233, 234. In embodiments wherein the mask 231 includes silicon nitride, the trench isolations 204, 205, 206 include silicon dioxide and the sidewall spacers 214, 225 include silicon dioxide, an etch process for selectively removing silicon nitride with respect to silicon dioxide and semiconductor materials such as silicon, silicon/germanium and/or silicon carbide, such as a wet etch process using phosphoric acid ($H_3PO_4$) or a dry etch process, for example, reactive ion etching (RIE) using an etch gas including, for example, $CHF_3$ and/or $C_2F_2$, may be used.

As detailed above, the topmost layer 219 of the encapsulation 215 may include silicon nitride. Hence, in embodiments wherein the mask 231 includes silicon nitride, in the removal of the mask 231, the topmost layer 219 of the encapsulation 215 may also be removed. The layer 218, being formed of a different material, such as silicon dioxide, may be used as an etch stop layer, protecting portions of the gate structure 249 and layers 216, 217 of the encapsulation 215 below the layer 218 from being affected by the etchant. Similarly, in the removal of the mask 231, the topmost layer 230 of the encapsulation 226 may be removed.

The layer 218 of the encapsulation 215 and the layer 229 of the encapsulation 226 may be removed during a cleaning process that is performed after the removal of the mask 231, for example a cleaning process wherein diluted hydrofluoric acid (DHF) is used.

After the removal of the mask 231, a mask 236 may be formed above the transistor 207. The mask 236 covers the gate structure 249, the portion of the semiconductor layer 203 in the transistor 207 and the raised source and drain regions 233, 234, and does not cover the transistor 208. In particular, the mask 236 does not cover portions of the semiconductor layer 203 adjacent the gate structure 250.

The mask 236 may be formed by depositing a layer of a material of the mask 236, for example silicon nitride, over the semiconductor structure 200 and patterning the layer by photolithography and etching, so that portions of the layer over the transistor 208 are removed.

After the formation of the mask 236, a deposition process 235 may be performed for depositing a semiconductor material on portions of the semiconductor layer 203 adjacent the gate structure 250. Similar to the deposition process 232 described above with reference to FIG. 2a, the deposition process 235 may be a selective deposition process, for example, a selective epitaxial growth process, wherein semiconductor material is deposited on exposed portions of the semiconductor layer 203 adjacent the gate structure 250, but only a small amount of semiconductor material or substantially no semiconductor material is deposited on the mask 236, the trench isolations 205, 206, the sidewall spacer 225 and the layer 228 of the encapsulation 226.

For performing the deposition process 235, any of the techniques described above in the context of the deposition process 232 may be used. However, the material of the raised source region 237 and the raised drain region 238 need not be identical to the material of the raised source region 233 and the raised drain region 234. In particular, in embodiments wherein the transistor 207 is one of a P-channel transistor and an N-channel transistor, and the transistor 208 is the other of a P-channel transistor and an N-channel transistor, the material of the raised source region 237 and the raised drain region 238 that is deposited in the deposition process 235 may be adapted for providing a different type of strain in the portion of the material layer 203 in the transistor 208 than in the portion of the material layer 203 in the transistor 207.

During the deposition process, a dopant may be supplied so that the raised source region 237 and the raised drain region 238 are in situ doped in accordance with the type of the transistor 208 (P-channel or N-channel).

Further features of the deposition process 235 may correspond to the features of the deposition process 232 described above.

Figure 2C:
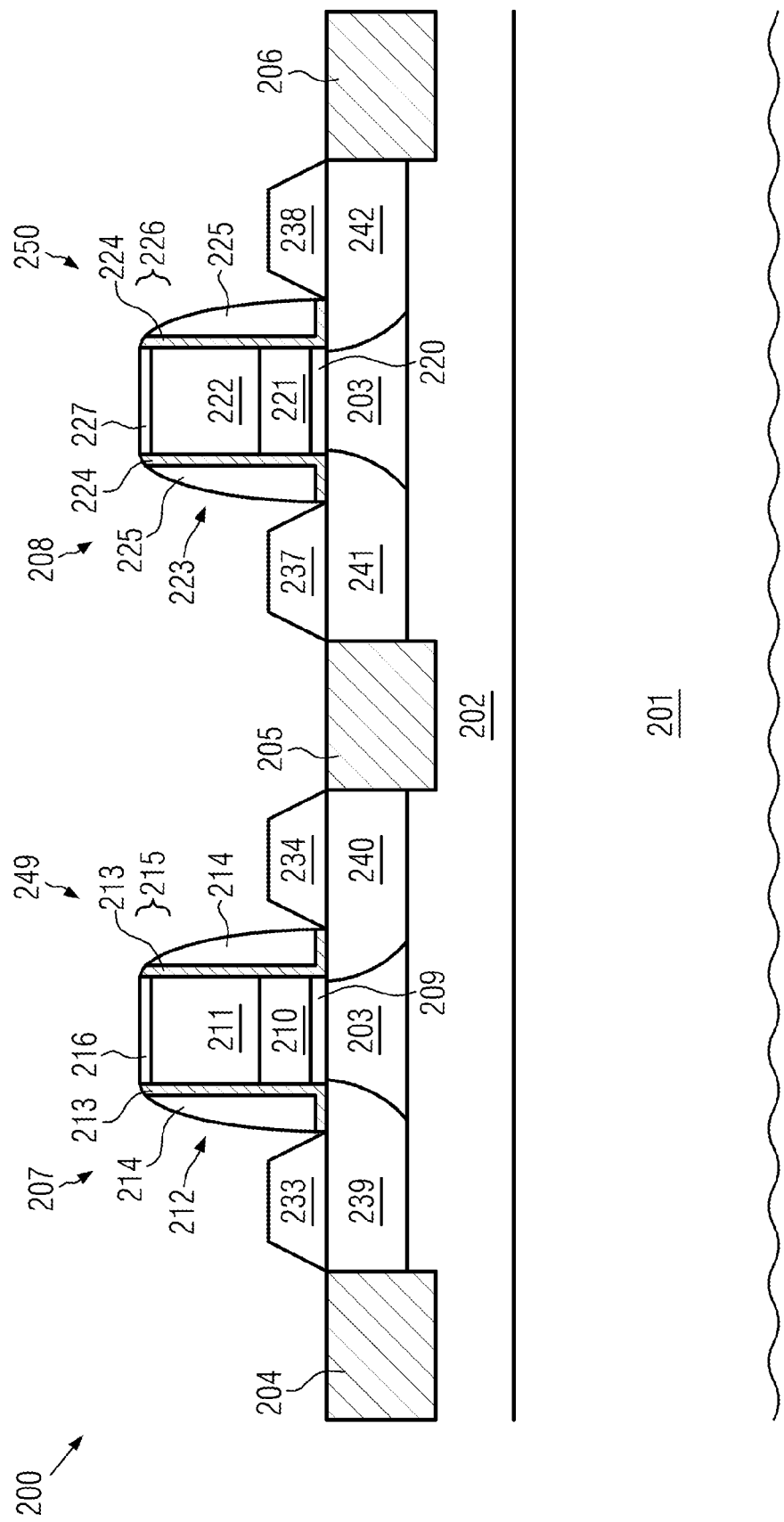

FIG. 2c shows a schematic cross-sectional view of the semiconductor structure 200 in a later stage of the manufacturing process. After the formation of the raised source region 237 and the raised drain region 238 in the transistor 208, the mask 236 and the layers 217, 228 of the encapsulations 215, 226, which may be formed of the same material as the mask 236, may be removed by means of an etch process adapted to selectively remove the material of the mask 236 relative to other materials of the semiconductor structure 200, such as materials of the trench isolations 204, 205, 206, the sidewall spacers 214, 225 and the layers 216, 227 of the encapsulations 215, 226. The etch process for removing the mask 236 may have features corresponding to those of the etch process for removing the mask 231 described above.

After the removal of the mask 236, an annealing process may be performed. The annealing process may be a thermal annealing process, such as a rapid thermal anneal, wherein the semiconductor structure 200 is irradiated with radiation from a lamp or a laser. Absorption of the radiation by the semiconductor structure 200 causes an increase of the temperature of the semiconductor structure 200. In other embodiments, an annealing process in an oven may be performed. The annealing process may be performed at a temperature in a range from about 550-700° C., and may be performed for a time in a range from about 15-45 minutes.

The annealing process causes a diffusion of a portion of the dopants in the raised source region 233 and the raised drain region 234 into the portion of the material layer 203 below the gate structure 249. Furthermore, during the annealing process, a portion of the dopants in the raised source region 237 and the raised drain region 238 in the transistor 208 may diffuse into the portion of the semiconductor layer 203 in the transistor 208.

The diffusion of the dopants causes a formation of a source region 239 below the raised source region 233 and a formation of a drain region 240 below the raised drain region 234. Since dopants may diffuse both in a thickness direction of the substrate 201 (vertical in the plane of drawing of FIG. 2c) and in lateral directions perpendicular to the thickness direction of the substrate 201 (horizontal in the plane of drawing of FIG. 2c), dopants from the raised source region 233 and the raised drain region 234 may diffuse into portions of the semiconductor layer 203 below the sidewall spacer 214 and/or below the gate electrode 211. Thus, the source region 239 and the drain region 240 may have an overlap with the gate structure 249, similar to source and drain extensions as described above with reference to FIG. 1. However, temperature and duration of the annealing process may be selected such that there is a portion below the gate electrode 212 into which substantially no diffusion of dopants occurs. This portion provides a channel region of the transistor 207.

Similarly, a source region 241 is formed below the raised source region 237 and a drain region 242 is formed below the raised drain region 238 in the transistor 208 due to the diffusion of dopants from the raised source and drain regions 237, 238 into the portion of the semiconductor layer 203 in transistor 208. Due to the diffusion of dopants into lateral directions perpendicular to the thickness direction of the substrate 201, the source region 241 and the drain region 242 may have an overlap with the gate structure 250. However, there is a portion of the semiconductor layer 203 below the gate electrode 226 into which substantially no diffusion of dopants occurs. This portion provides a channel region of the transistor 208.

Thus, in the annealing process, doped source regions 239, 241 and doped drain regions 240, 242 may be formed, wherein no ion implantation process is required. Hence, adverse effects of ion implantation processes, such as an amorphization of semiconductor material, may be avoided, which may help providing a lower resistance between the source and drain regions 239, 240, 241, 242 and the channel region of the respective one of the transistors 207, 208, an improvement of the drive currents of the transistors 207, 208, lower leakage currents of the transistors 207, 208, and/or a better yield in the production of integrated circuits comprising transistors 207, 208.

Before the annealing process, or at least before the deposition processes 232, 235, a doping of portions of the semiconductor layer 203 below the gate electrode 212 may be substantially equal to a doping of portions of the semiconductor structure 203 adjacent the gate structure 249 wherein the source and drain regions 239, 240 will be formed in the annealing process.

Similarly, before the annealing process, or at least before the deposition processes 232, 235, a doping of portions of the semiconductor layer 203 below the gate electrode 223 may be substantially equal to a doping of portions of the semiconductor layer 203 adjacent the gate structure 250 wherein the source and drain region 241, 242 may be formed in the annealing process.

In some embodiments, a dopant concentration in the portions of the semiconductor layer 203 in transistors 207, 208 before the annealing process may be approximately equal to an initial dopant concentration in the semiconductor layer 203 before the formation of the gate structures 249, 250, or the portions of the semiconductor layer 203 in the transistors 207, 208 may be substantially undoped before the annealing process.

Figure 2D:
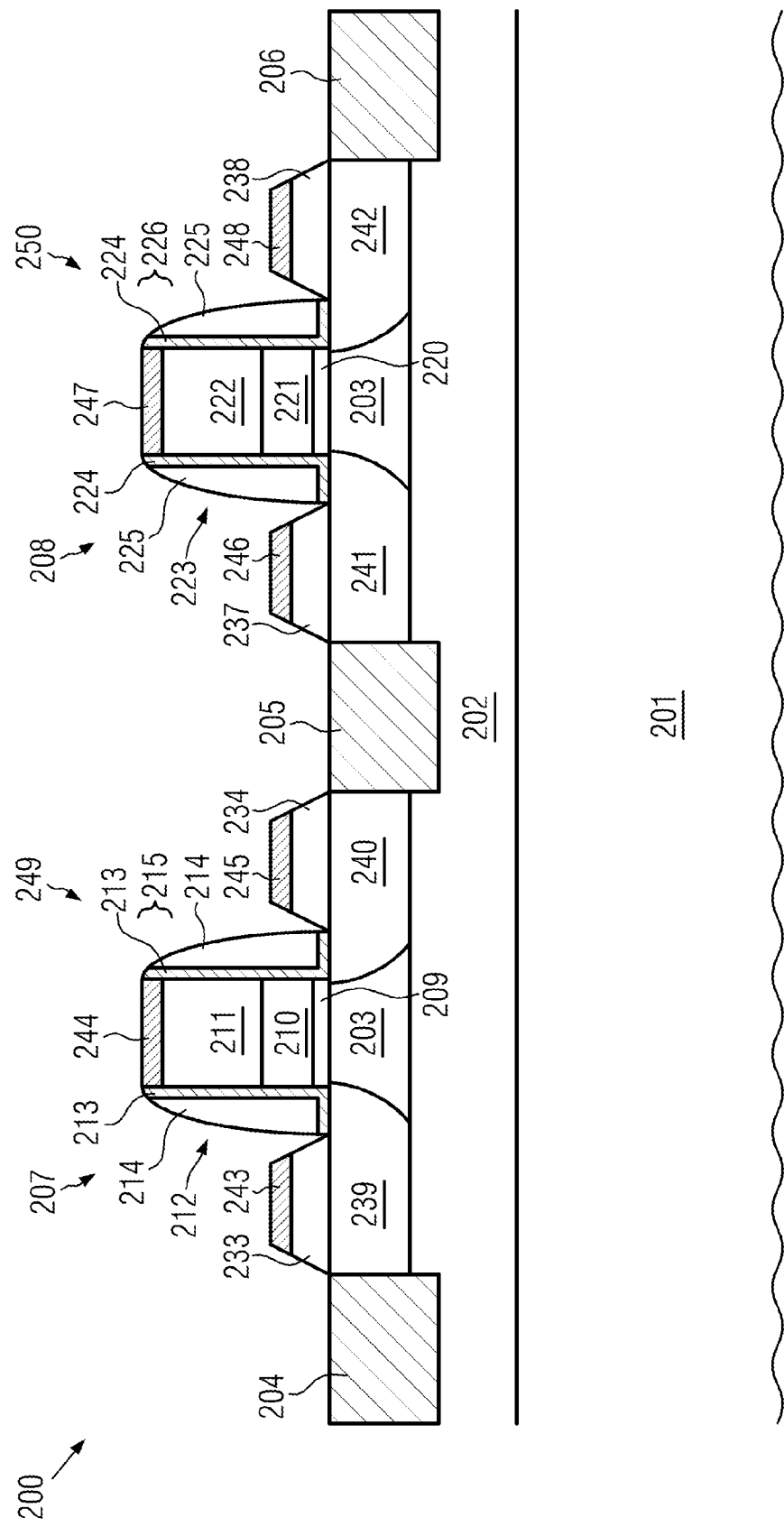

FIG. 2d shows a schematic cross-sectional view of the semiconductor structure 200 in a later stage of the manufacturing process. After the annealing process wherein the source regions 239, 241 and the drain regions 240, 242 are formed, silicide regions 243, 244, 245 may be formed in the raised source region 233, the polysilicon portion 211 of the gate electrode 212 and the raised drain region 234 of the transistor 207. Similarly, silicide regions 246, 247, 248 may be formed in the raised source region 237, the polysilicon portion 222 of the gate electrode 223 and the raised drain region 238 of the transistor 208.

For this purpose, after removal of the layer 216 of the encapsulation 215 and the layer 227 of the encapsulation 226 by an etch process, a layer of a metal, such as nickel, cobalt, platinum, titanium, tungsten or an alloy of nickel and platinum, may be deposited over the semiconductor structure 200, and a further annealing process may be performed for inducing a chemical reaction between the metal and the semiconductor material in the raised source regions 233, 237, the polysilicon portions 211, 222 of the gate electrodes 212, 223 and the raised drain regions 234, 238. Thereafter, residuals of the metals which have not reacted with semiconductor material may be removed by an etch process.

The silicide regions 243, 244, 245, 246, 247, 248 may provide a lower contact resistance between the transistors 207, 208 and electrical contacts for connection to the transistors 207, 208 compared to embodiments wherein no silicide regions 243, 244, 245, 246, 247, 248 are formed.

Further embodiments will be described with respect to FIGS. 3a to 8c.

FIG. 3a shows a schematic top view of a semiconductor structure 300 according to an embodiment in a stage of a manufacturing process according to an embodiment. FIG. 3b shows a schematic cross-sectional view of the semiconductor structure 300 along the line A-A and FIG. 3c shows a schematic cross-sectional view of the semiconductor structure 300 along the line B-B.

The semiconductor structure 300 includes a substrate 301 that may be formed of a semiconductor material such as silicon, an electrically insulating layer 302 that may be formed of a dielectric material such as silicon dioxide, and an electrically conductive semiconductor feature 303 comprised of elongated semiconductor lines 304, 305, 306 that are formed on the electrically insulating layer 302.

The semiconductor feature 303 may include silicon or another semiconductor material, such as silicon/germanium, silicon carbide or a III-V semiconductor material such as gallium arsenide.

The semiconductor structure 300 may be formed as follows. A semiconductor-on-insulator structure is provided. The semiconductor-on-insulator structure includes the substrate 301, the electrically insulating layer 302 and a layer of a semiconductor material from which the semiconductor feature 303 is to be formed. In some embodiments, the semiconductor-on-insulator structure may be an extremely thin semiconductor-on-insulator (ETSOI) structure, wherein the electrically insulating layer 302 has a thickness in a range from about 10-20 nm, and the layer of semiconductor material has a thickness in a range from about 5-8 nm.

Techniques for providing the semiconductor-on-insulator structure may correspond to those of the formation of the semiconductor-on-insulator structure including the substrate 201, the electrically insulating layer 202 and the semiconductor layer 203 described above in the context of the description of FIG. 2a.

The layer of semiconductor material may be structured using techniques of photolithography and etching for forming the elongated semiconductor lines 304, 305, 306. In the structuring of the layer of semiconductor material, semiconductor material between the elongated semiconductor lines 304, 305, 306 is removed, whereas portions of the layer of semiconductor material remaining on the electrically insulating layer 302 form the elongated semiconductor lines 304, 305, 306.

An extension of the elongated semiconductor lines 304, 305, 306 in a length direction of the elongated semiconductor lines 304, 305, 306 (vertical in the view of FIG. 3a and horizontal in the view of FIG. 3c) may be greater than an extension of the elongated semiconductor lines 304, 305, 306 in a width direction of the elongated semiconductor lines 304, 305, 306 (horizontal in the views of FIGS. 3a and 3b).

In some embodiments, the extension of the elongated semiconductor lines 304, 305, 306 in the width direction may be in the same range as the thickness of the layer of semiconductor material from which the elongated semiconductor lines 304, 305, 306 are formed. In some embodiments, the elongated semiconductor lines 304, 305, 306 may have a width in a range from about 5-8 nm, and may form nanowires. In other embodiments, a width of the elongated semiconductor lines 304, 305, 306 and/or a thickness of the elongated semiconductor lines 304, 305, 306 may be greater.

For photolithographically forming elongated semiconductor lines 304, 305, 306 having a width in a range from about 5-8 nm, multiple patterning techniques which allow forming features having dimensions substantially smaller than a wavelength of radiation used in the photolithography process may be employed.

Figure 4A:
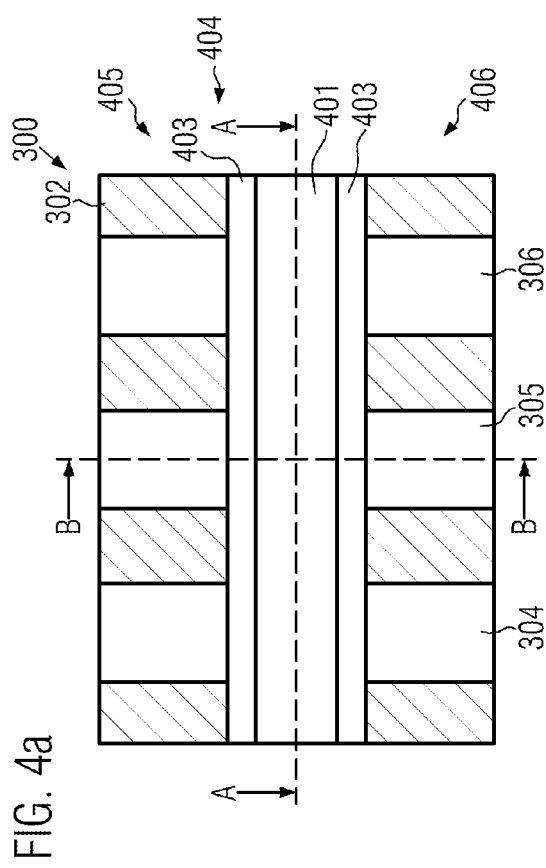
FIGS. 4a, 4b and 4c show a schematic top view and cross-sectional views, respectively, of a semiconductor structure according to an embodiment in a stage of a method according to an embodiment.
Figure 4C:
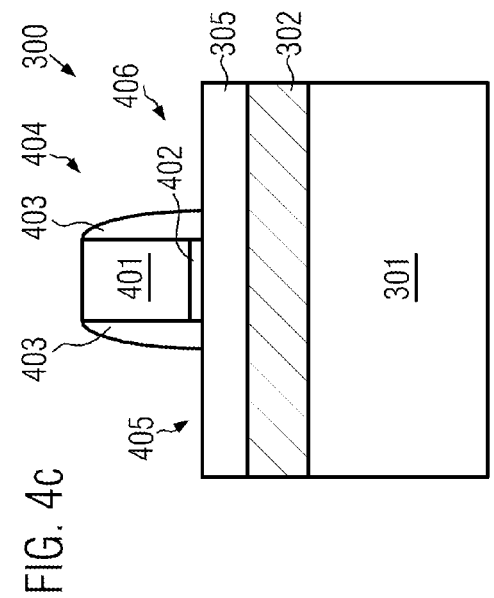
Figure 4B:
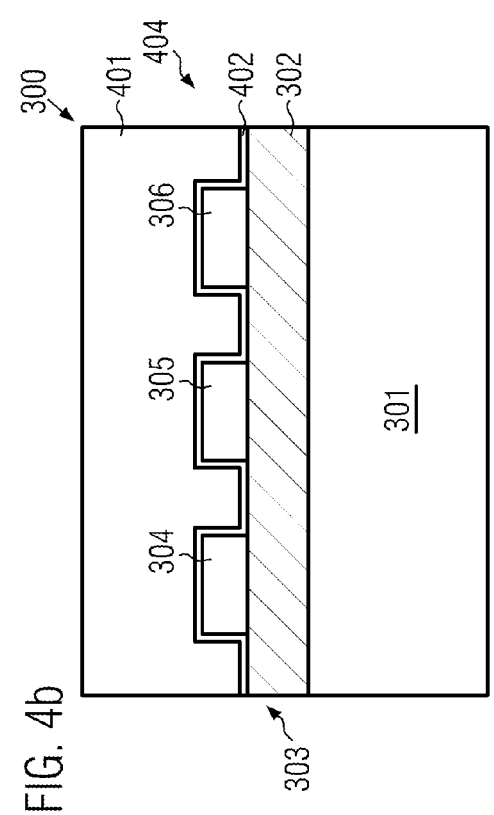

FIGS. 4a, 4b, and 4c show schematic views of the semiconductor structure 300 in a later stage of the manufacturing process. FIG. 4a shows a schematic top view of the semiconductor structure 300, and FIGS. 4b and 4c show schematic cross-sectional views along the lines A-A and B-B, respectively.

A dummy gate insulation layer 402 and a dummy gate electrode 401 are formed on the elongated semiconductor lines 304, 305, 306. The dummy gate insulation layer 402 and the dummy gate electrode 401 may be formed by depositing a layer of a material of the dummy gate insulation layer, for example, a layer of silicon dioxide, having a thickness in a range from about 2-3 nm and a layer of a material of the dummy gate electrode, for example, a layer of polysilicon, having a thickness in a range from about 40-60 nm by means of deposition processes such as chemical vapor deposition and/or plasma-enhanced chemical vapor deposition, and patterning the layers of the dummy gate insulation material 402 and the dummy gate electrode material 401 by means of photolithography and etching.

A sidewall spacer 403 may be formed adjacent the gate electrode 401. The sidewall spacer 403 may include silicon nitride. The sidewall spacer may be formed by substantially isotropically depositing a layer of the material of the sidewall spacer 403 and performing an anisotropic etch process, similar to the formation of the sidewall spacers 214, 225 described above in the context of the embodiments of FIGS. 2a-2d. In some embodiments, a liner layer (not shown) similar to liner layers 213, 224 described above may be provided between the gate electrode 401 and the sidewall spacer 403.

The dummy gate insulation layer 402, the dummy gate electrode 401, the sidewall spacer 403 and the optional liner layer form a gate structure 404.

The gate structure 404 has a source side 405 and a drain side 406, wherein the source side 405 and the drain side 406 are located on opposite sides of the gate structure 404. The gate structure 404 does not cover the entire elongated semiconductor lines 304, 305, 306. Instead, portions of the elongated semiconductor lines 304, 305, 306 on the source side 405 and the drain side 406 of the gate structure 404 are not covered by the gate structure 404. Thus, the elongated semiconductor lines 304, 305, 306 extend from the source side 405 of the gate structure 404 to the drain side 406.

FIGS. 5a, 5b and 5c show schematic views of the semiconductor structure 300 in a later stage of the manufacturing process. FIG. 5a shows a schematic top view of the semiconductor structure 300, and FIGS. 5b and 5c show schematic cross-sectional views along the lines A-A and B-B, respectively.

A raised source region 501 is formed on the source side 405 of the gate structure 404. On the drain side 406 of the gate structure 404, a raised drain region 502 is formed. The raised source region 501 and the raised drain region 502 may be formed by depositing an in situ doped semiconductor material on portions of the elongated semiconductor lines 304, 305, 306 adjacent the gate structure 404. The type of dopant in the raised source region 501 and the raised drain region 502 may correspond to a type of transistor to be formed in the semiconductor structure 300. In particular, in embodiments wherein a P-channel field effect transistor is to be formed, the raised source region 501 and the raised drain region 502 may include a P-type dopant and in embodiments wherein an N-channel field effect transistor is to be formed, the raised source region 501 and the raised drain region 502 may include an N-type dopant.

The material of the raised source region 501 and the raised drain region 502 may be the same material as the material from which the elongated semiconductor lines 304, 305, 306 are formed, or different materials may be used for the raised source region 501 and the raised drain region 502, on the one hand, and for the elongated semiconductor lines 304, 305, 306, on the other hand, for providing a strain in the elongated semiconductor lines 304, 305, 306 as detailed above in the context of the description of the raised source and drain regions 233, 234, 237, 238 in the embodiments of FIGS. 2a-2d.

The formation of the raised source region 501 and the raised drain region 502 may include a selective epitaxial growth process, wherein the material of the raised source region 501 and the raised drain region 502 is deposited on the exposed portions of the elongated semiconductor lines 304, 305, 306, but substantially no deposition of material occurs on the gate structure 404. In embodiments wherein the dummy gate electrode 401 includes polysilicon, one or more encapsulation layers similar to the layers of the encapsulations 215, 226 described above in the context of the embodiments of FIGS. 2a-2d (not shown), for example a silicon nitride layer, may be formed on the dummy gate electrode 401 so that substantially no deposition of material or only a deposition of a small amount of material occurs on the dummy gate electrode 401.

In some embodiments, portions of the semiconductor structure 300 which are not shown in FIGS. 5a-5c may be covered by a mask, for example, a hardmask including silicon nitride, during the formation of the raised source region 501 and the raised drain region 502, and the portion of the semiconductor structure 300 shown in FIGS. 5a-5c may be covered by a mask, for example a hardmask, when raised source and drain regions similar to raised source regions 501, 502 are formed in other portions of the semiconductor structure 300 that are not shown in FIGS. 5a-5c. Thus, differently doped raised source and drain regions may be formed in different portions of the semiconductor structure 300.

After the formation of the raised source region 501 and the raised drain region 502, an anneal process may be performed for diffusing dopants from the raised source region 501 and the raised drain region 502 into portions of the elongated semiconductor lines 304, 305, 306 adjacent the gate structure 404. Thus, a source region 505 and a drain region 506 may be formed in each of the elongated semiconductor lines 304, 305, 306. Since dopants from the raised source region 501 and the raised drain region 502 may diffuse both in directions parallel to a thickness direction of the substrate 301 (vertical in the views of FIGS. 5b and 5c) and in lateral directions of the semiconductor structure 300 (horizontal in the views of FIGS. 5b and 5c), portions of the source region 505 and the drain region 506 may extend below the gate structure 404.

Thus, in the anneal process, doped source and drain regions 505, 506 may be formed in the elongated semiconductor lines 304, 305, 306 without an ion implantation process which might lead to an amorphization of the semiconductor material of the elongated semiconductor lines 304, 305, 306. Before the anneal process, or at least before the formation of the raised source region 501 and the raised drain region 502, dopant concentrations in the portions of the elongated semiconductor lines wherein the source region 505 and the drain region 506 will be formed in the anneal process may be substantially equal to dopant concentrations in portions of the elongated semiconductor lines 304, 305, 306 below the gate structure 404 wherein a channel region is provided, or the elongated semiconductor lines 304, 305, 306 may be substantially undoped.

Features of the anneal process performed for diffusing dopants from the raised source region 501 and the raised drain region 502 into the elongated semiconductor lines 304, 305, 306 may correspond to those of the anneal process used for forming the source and drain regions 239, 240, 241, 242 in the embodiments described above with reference to FIGS. 2a-2d.

In some embodiments, silicide regions 503, 504 may be formed in the raised source region 501 and the raised drain region 502. For this purpose, a metal layer may be deposited over the semiconductor structure 300, and an anneal process may be performed for initiating a chemical reaction between the metal of the metal layer and the semiconductor material of the raised source region 501 and the raised drain region 502. Features of the formation of the silicide regions 503, 504 may correspond to those of the formation of silicide regions 243-248 in the embodiments described above with reference to FIGS. 2a-2d. The polysilicon of the dummy gate electrode 401 may be protected by an encapsulation during the formation of the silicide, so that no silicide is formed in the dummy gate electrode 401.

FIGS. 6a, 6b and 6c show schematic views of the semiconductor structure 300 in a later stage of the manufacturing process. FIG. 6a shows a schematic top view, and FIGS. 6b and 6c show schematic cross-sectional views along lines A-A and B-B, respectively.

After the formation of the silicide regions 503, 504, a dielectric layer 601 may be formed on the semiconductor structure 300. In some embodiments, the dielectric layer 601 may include silicone dioxide, and may be formed by means of a chemical vapor deposition process or a plasma-enhanced chemical vapor deposition process wherein tetraethyl orthosilicate (TEOS) is used as a reactant.

After the formation of the dielectric layer 601, a planarization process, for example a chemical mechanical polishing process, may be performed for providing a substantially planar surface of the semiconductor structure 300 and for exposing the dummy gate electrode 401. In some embodiments wherein an encapsulation including silicon dioxide and/or silicon nitride is provided on the dummy gate electrode 401, the encapsulation may also be removed during the chemical mechanical polishing process.

FIGS. 7a, 7b and 7c show schematic views of the semiconductor structure 300 in a later stage of the manufacturing process. FIG. 7a shows a schematic top view, and FIGS. 7b and 7c show schematic cross-sectional views along lines A-A and B-B, respectively.

After the planarization process wherein the dummy gate electrode 401 is exposed, the dummy gate electrode 401 and the dummy gate insulation layer 402 may be removed. This may be done by means of a first etch process adapted to selectively remove the material of the dummy gate electrode 401 relative to the material or materials of the dielectric layer 601 and the dummy gate insulation layer 402 and a second etch process adapted to selectively remove the material of the dummy gate insulation layer 402 relative to the material of the elongated semiconductor lines 304, 305, 306.

The removal of the dummy gate electrode 401 and the dummy gate insulation layer 402 forms a recess 701 in the semiconductor structure 300. At the bottom of the recess 701, portions of the electrically insulating layer 302 and the elongated semiconductor lines 304, 305, 306 are exposed, as shown in FIGS. 7a and 7b.

Figure 8A:
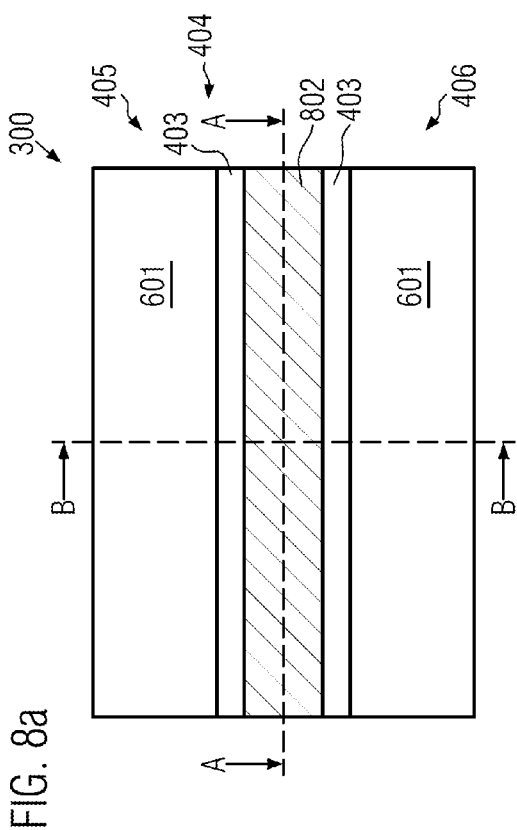
FIGS. 8a, 8b and 8c show a schematic top view and cross-sectional views, respectively, of a semiconductor structure according to an embodiment in a stage of a method according to an embodiment.
Figure 8C:
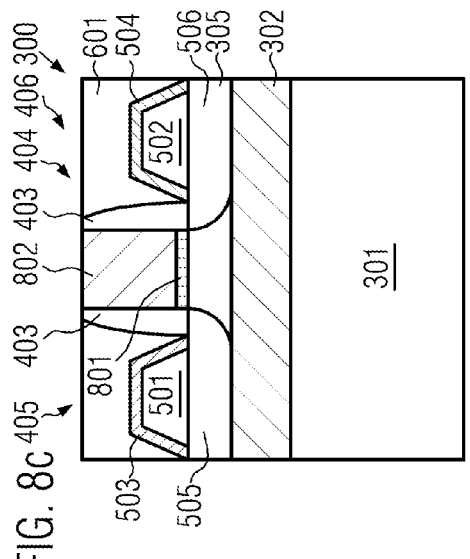
Figure 8B:
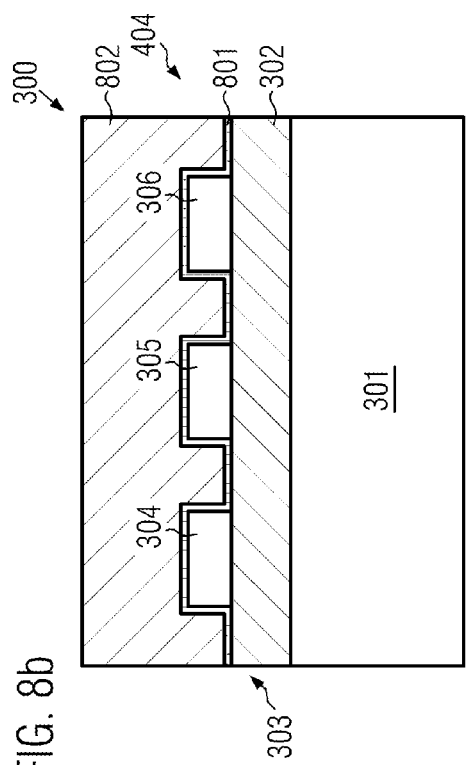

FIGS. 8a, 8b and 8c show schematic views of the semiconductor structure 300 in a later stage of the manufacturing process. FIG. 8a shows a schematic top view, and FIGS. 8b and 8c show schematic cross-sectional views along lines A-A and B-B, respectively.

After the formation of the recess 701, a gate insulation layer 801 and a gate electrode 802 may be formed in the recess 701. For this purpose, one or more deposition processes may be performed for depositing one or more materials of the gate insulation layer 801 over the semiconductor structure 300. The one or more deposition processes may be anisotropic deposition processes, so that substantially no or only a small amount of the material of the gate insulation layer 801 is deposited on sidewalls of the recess 701.

The gate insulation layer 801 may include a high-k material having a greater dielectric constant than silicon dioxide, for example a dielectric constant greater than four. In some embodiments, the gate insulation layer 801 may include hafnium dioxide and/or hafnium silicon oxynitride.

After the formation of the gate insulation layer 801, a gate electrode 802 may be formed. For this purpose, one or more deposition processes may be performed for depositing one or more materials of the gate electrode 802 over the semiconductor structure 300. The deposition processes may be anisotropic deposition processes.

The gate electrode 802 may include a metal having a work function adapted to the work function of the semiconductor material of the elongated semiconductor lines 304, 305, 306. In some embodiments, different metals may be used for P-type transistors and N-type transistors formed in different portions of the semiconductor structure 300.

In some embodiments, the entire gate electrode 802 may be formed of a metal. In other embodiments, the gate electrode 802 may include a metal portion and a polysilicon portion, similar to the gate electrodes 212, 223 described above in the context of the embodiments of FIGS. 2a-2d.

After the deposition of the material or materials of the gate electrode 802, a planarization process, for example a chemical mechanical polishing process, may be performed for removing material of the gate insulation layer and material of the gate electrode that has been deposited on the dielectric layer 601.

Thus, a tri-gate field effect transistor, wherein the gate electrode 802 is provided above fins provided by the elongated semiconductor lines 304, 305, 306, may be formed.

Thereafter, electric contacts to the raised source and drain regions 501, 502 and the gate electrode 802 and back-end wiring may be formed in accordance with standard process flows.

In the above description, embodiments wherein gate electrodes of fully depleted field effect transistors are formed before the formation of source and drain regions have been described with reference to FIGS. 2a-2d, and embodiments wherein gate electrodes of tri-gate transistors are formed after the formation of the source and drain regions have been described with reference to FIGS. 3a-8c. However, the present disclosure is not limited to such embodiments. In other embodiments, a gate-first approach as described above with reference to FIGS. 2a-2d may be employed in the formation of tri-gate transistors, and a gate-last approach as described above with reference to FIGS. 3a-8c may be employed in the formation of fully depleted field effect transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure comprising a substrate, an electrically insulating layer formed on said substrate and one or more elongated semiconductor lines formed on said electrically insulating layer;
forming a dummy gate structure on said one or more elongated semiconductor lines, said dummy gate structure comprising a dummy gate insulation layer, a dummy gate electrode formed above said dummy gate insulation layer, and a sidewall spacer formed adjacent to said dummy gate electrode, wherein said one or more elongated semiconductor lines extend from a source side of said dummy gate structure to a drain side of said dummy gate structure;
depositing an in situ doped semiconductor material on portions of said one or more elongated semiconductor lines formed adjacent to each of said source and drain sides of said dummy gate structure;
diffusing dopant from said in situ doped semiconductor material into said portions of said one or more elongated semiconductor lines formed adjacent to each of said source and drain sides of said dummy gate structure, the diffusion of the dopant into said portions of said one or more elongated semiconductor lines formed adjacent to each of said source and drain sides of said dummy gate structure forming doped source and drain regions in said one or more elongated semiconductor lines;
forming a dielectric layer on said semiconductor structure and above said dummy gate structure;
after forming said dielectric layer, polishing said semiconductor structure so as to expose said dummy gate electrode;
removing said exposed dummy gate electrode and said dummy gate insulation layer from said dummy gate structure so as to form a recess in said semiconductor structure, said recess exposing portions of said one or more elongated semiconductor lines at a bottom of said recess;
forming a gate insulation layer comprising a material having a greater dielectric constant than silicon dioxide and a gate electrode comprising a metal in said recess.

2. The method of claim 1, wherein depositing said in situ doped semiconductor material comprises performing a selective growth process wherein said in situ doped semiconductor material is selectively deposited on exposed portions of said one or more elongated semiconductor lines.

3. The method of claim 2, wherein said selective growth process is selected from the group comprising chemical vapor deposition, plasma-enhanced chemical vapor deposition, metal-organic chemical vapor deposition and molecular beam epitaxy.

4. The method of claim 2, wherein a dopant species is supplied during said selective growth process.

5. The method of claim 1, wherein diffusing the dopant material comprises performing an annealing process.

6. The method of claim 1, wherein said portions of said one or more elongated semiconductor lines formed adjacent to each of said source and drain sides of said dummy gate structure and a portion of said one or more elongated semiconductor lines formed below said dummy gate structure are substantially undoped at least until the deposition of said in situ doped semiconductor material.

7. The method of claim 1, wherein a doping of said portions of said one or more elongated semiconductor lines formed adjacent to each of said source and drain sides of said dummy gate structure is substantially the same as a doping of a portion of said one or more elongated semiconductor lines formed below said gate structure at least until the deposition of said in situ doped semiconductor material.

8. The method of claim 1, further comprising forming a silicide in said in situ doped semiconductor material.

9. The method of claim 1, wherein said one or more elongated semiconductor lines comprises a portion of a semiconductor layer formed on said electrically insulating layer.

10. A method, comprising:
providing a semiconductor structure comprising a semiconductor substrate, a layer of an electrically insulating material on said substrate, a first semiconductor feature on said electrically insulating material and a second semiconductor feature on said electrically insulating material;
forming a first gate structure comprising a first encapsulation on said first semiconductor feature and a second gate structure comprising a second encapsulation on said second semiconductor feature, first encapsulation comprising a first plurality of material layers and said second encapsulation comprising a second plurality of material layers;
forming a first mask above said semiconductor structure, wherein said first mask covers said second gate structure and said second semiconductor feature and said first mask does not cover said first gate structure and said first semiconductor feature;
depositing a first in situ doped semiconductor material on said first semiconductor feature adjacent said first gate structure, said first in situ doped semiconductor material comprising a first dopant;
removing said first mask, wherein removing said first mask comprises removing at least a first layer of each of said first and second pluralities of material layers from above said respective first and second gate structures while leaving at least a second layer of each of said first and second pluralities of material layers above said respective first and second gate structures;
forming a second mask, wherein said second mask covers said first gate structure and said first semiconductor feature and said second mask does not cover said second gate structure and said second semiconductor feature;
depositing a second in situ doped semiconductor material on said second semiconductor feature adjacent said second gate structure, said second in situ doped semiconductor material comprising a second dopant different from said first dopant;
removing said second mask, wherein removing said second mask comprises removing at least a third layer of each of said first and second pluralities of material layers from above said respective first and second gate structures while leaving said at least said second layer of each of said first and second pluralities of material layers above said respective first and second gate structures; and
performing an annealing process wherein a portion of said first dopant diffuses from said first in situ doped semiconductor material into said portions of said first semiconductor feature adjacent said first gate structure and a portion of said second dopant diffuses from said second in situ doped semiconductor material into said portions of said second semiconductor feature adjacent said second gate structure.

11. The method of claim 10, wherein one of said first dopant and said second dopant is a P-type dopant and the other of said first dopant and said second dopant is an N-type dopant.

12. The method of claim 11, wherein each of said first and said second mask is a hardmask comprising at least one of silicon nitride, silicon oxynitride and silicon dioxide.

13. The method of claim 12, wherein any of said first and second pluralities of layers comprising said first and second encapsulations that are exposed during the deposition of said first in situ doped semiconductor material or during the deposition of said second in situ doped semiconductor material comprise at least one of silicon nitride, silicon oxynitride and silicon dioxide.

14. The method of claim 13, wherein each of the deposition of said first in situ doped semiconductor material and the deposition of said second in situ doped semiconductor material comprises performing a selective growth process wherein substantially no in situ doped semiconductor material is deposited on the materials of either of said first and second hardmasks or on any exposed portions of said first and second gate structures.

15. The method of claim 10, wherein said first and said second in situ doped semiconductor materials comprise different semiconductor materials.

16. The method of claim 10, wherein said first semiconductor feature comprises a first portion of a semiconductor layer and said second semiconductor feature comprises a second portion of a semiconductor layer.

17. The method of claim 10, wherein said first semiconductor feature comprises one or more first elongated semiconductor lines extending from a source side of said first gate structure to a drain side of said first gate structure, said drain side of said first gate structure being opposite said source side of said first gate structure, and said second semiconductor feature comprises one or more second elongated semiconductor lines extending from a source side of said second gate structure to a drain side of said second gate structure, said drain side of said second gate structure being opposite said source side of said second gate structure.

18. A device, comprising:
a semiconductor structure comprising a semiconductor substrate, an electrically insulating material positioned on said semiconductor substrate, and a plurality of laterally spaced-apart semiconductor lines positioned on said electrically insulating material;
a gate structure positioned on and extending laterally across each of said plurality of laterally spaced-apart semiconductor lines;
a raised source region and a raised drain region positioned on lateral portions of each of said plurality of laterally spaced-apart semiconductor lines that are adjacent to and extend laterally away from respective source and drain sides of said gate structure, wherein said lateral portions of each of said plurality of laterally spaced-apart semiconductor lines are differently doped than a portion of each of said plurality of laterally spaced-apart semiconductor lines that are positioned below said gate structure and comprise the same dopant as said raised source region and said raised drain region, and wherein said lateral portions of each of said plurality of laterally spaced-apart semiconductor lines have a substantially single crystalline structure.

19. The device of claim 18, wherein said raised source region and said raised drain region comprise a different semiconductor material than said plurality of laterally spaced-apart semiconductor lines.

20. The device of claim 19, wherein said plurality of laterally spaced-apart semiconductor lines comprise at least one of strained silicon, substantially unstrained silicon, silicon carbide, silicon/germanium and a III-V semiconductor material.

21. The device of claim 19, wherein said raised source region and said raised drain region comprise at least one of silicon, silicon/germanium, silicon carbide and a III-V semiconductor material.

22. The device of claim 19, wherein each of said raised source region and said raised drain region comprises a silicide.

23. The device of claim 19, wherein said comprising device comprises one of a semiconductor-on-insulator FinFET transistor and a semiconductor-on-insulator tri gate transistor.

24. The method of claim 10, further comprising, prior to depositing said first and second in situ doped semiconductor materials, forming a first sidewall spacer adjacent to said first gate structure and forming a second sidewall spacer adjacent to said second gate structure.

* * * * *

UNITED STATES PATENT AND TRADEMARK OFFICE
CERTIFICATE OF CORRECTION

PATENT NO.        : 8,835,936 B2                                    Page 1 of 1
APPLICATION NO.   : 13/678124
DATED             : September 16, 2014
INVENTOR(S)       : Hoentschel et al.

It is certified that error appears in the above-identified patent and that said Letters Patent is hereby corrected as shown below:

In the Claims

In claim 23, at column 21, line 17, delete "said comprising device" and insert therefor -- said device --.

Signed and Sealed this
Twenty-seventh Day of January, 2015

Michelle K. Lee
*Deputy Director of the United States Patent and Trademark Office*